(12) United States Patent
Roohparvar

(10) Patent No.: US 7,376,024 B2
(45) Date of Patent: *May 20, 2008

(54) USER CONFIGURABLE COMMANDS FOR FLASH MEMORY

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/441,545

(22) Filed: May 26, 2006

(65) Prior Publication Data

US 2006/0215455 A1   Sep. 28, 2006

Related U.S. Application Data

(63) Continuation of application No. 10/930,439, filed on Aug. 31, 2004, now Pat. No. 7,230,850.

(51) Int. Cl.
*G11C 7/00* (2006.01)

(52) U.S. Cl. .................. 365/189.17; 365/189.07; 365/189.12; 365/191

(58) Field of Classification Search ............... 365/194, 365/191, 189.07, 189.12, 185.17
See application file for complete search history.

(56) References Cited

U.S. PATENT DOCUMENTS

| 5,781,756 | A | 7/1998 | Hung |
| 6,204,687 | B1 | 3/2001 | Schultz |
| 6,707,734 | B2 * | 3/2004 | Demone ............... 365/200 |
| 7,230,850 | B2 * | 6/2007 | Roohparvar ........ 365/185.17 |

* cited by examiner

*Primary Examiner*—Pho M. Luu
(74) *Attorney, Agent, or Firm*—Leffert Jay & Polglaze, P.A.

(57) ABSTRACT

A memory device includes a plurality of memory dies, each having an assigned address. A register on each die is reset on power-up. Boot data is loaded as part of the initialization routine. If the boot data includes a reconfigured command, that command is loaded into the register. A signal is generated if the register has been altered by the stored reconfigured command. If the signal indicates that the register has not been altered, a received command is executed without reconfiguration. If the signal indicates that the register contains something other than the reset state, the contents of the register are compared with the received command. If the received command and the register contents are equal, the reconfigured command is executed.

9 Claims, 4 Drawing Sheets

USER CONFIGURABLE COMMANDS FOR FLASH MEMORY

RELATED APPLICATION

This Application is a Continuation of U.S. application Ser. No. 10/930,439, titled "USER CONFIGURALBE COMMANDS FOR FLASH MEMORY," filed Aug. 31, 2004 now U.S. Pat. No. 7,230,850, which is commonly assigned and incorporated herein by reference.

TECHNICAL FIELD OF THE INVENTION

The present invention relates generally to memory devices and in particular the present invention relates to a flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory devices may be manufactured in a NOR architecture or a NAND architecture. In a NOR configuration, the cells are arranged in a matrix. The gates of each floating gate memory cell of the array matrix are connected by rows to wordlines and their drains are connected to column bitlines. The source of each floating gate memory cell is typically connected to a common source line.

A NAND flash is comprised of an array of floating gate cells arranged in series chains. Each of the floating gate cells are coupled drain to source in each series chain. A word line that spans across multiple series chains is coupled to the control gates of each floating gate cell in a row in order to control their operation. The bitlines are eventually coupled to sense amplifiers that detect the state of each cell.

In order to increase the memory density of flash memory devices, manufacturers are stacking memory dies so that each device may be comprised of multiple dies. In such a device, the dies typically use a common chip enable line and an address line is used to select between the dies. This stacking scheme treats two or more memory devices as if they were one memory space.

A problem exists when a command is used that does not require an address (e.g., read status). When such a command is transmitted to the memory devices without differentiating which device is being addressed, all of the devices will transmit back substantially simultaneously on the same bus.

One way to get around this problem is to redefine the commands that do not have addresses to include an address associated with the command. However, this is difficult to implement since, once the die is preprogrammed, it must be marked as having a particular address. When a memory device is manufactured from multiple dies, the dies must be correctly assembled in an integrated circuit so that no two dies with the same address end up in the same memory device. Such an assembly process requires detailed labeling and tracking of the differently programmed dies. This creates a logistical problem for manufacturers.

For the reasons stated above, and for other reasons stated below which will become apparent to those skilled in the art upon reading and understanding the present specification, there is a need in the art for a flash memory device that has multiple memory dies that can be individually addressed with all memory commands.

DETAILED DESCRIPTION

Figure 1:
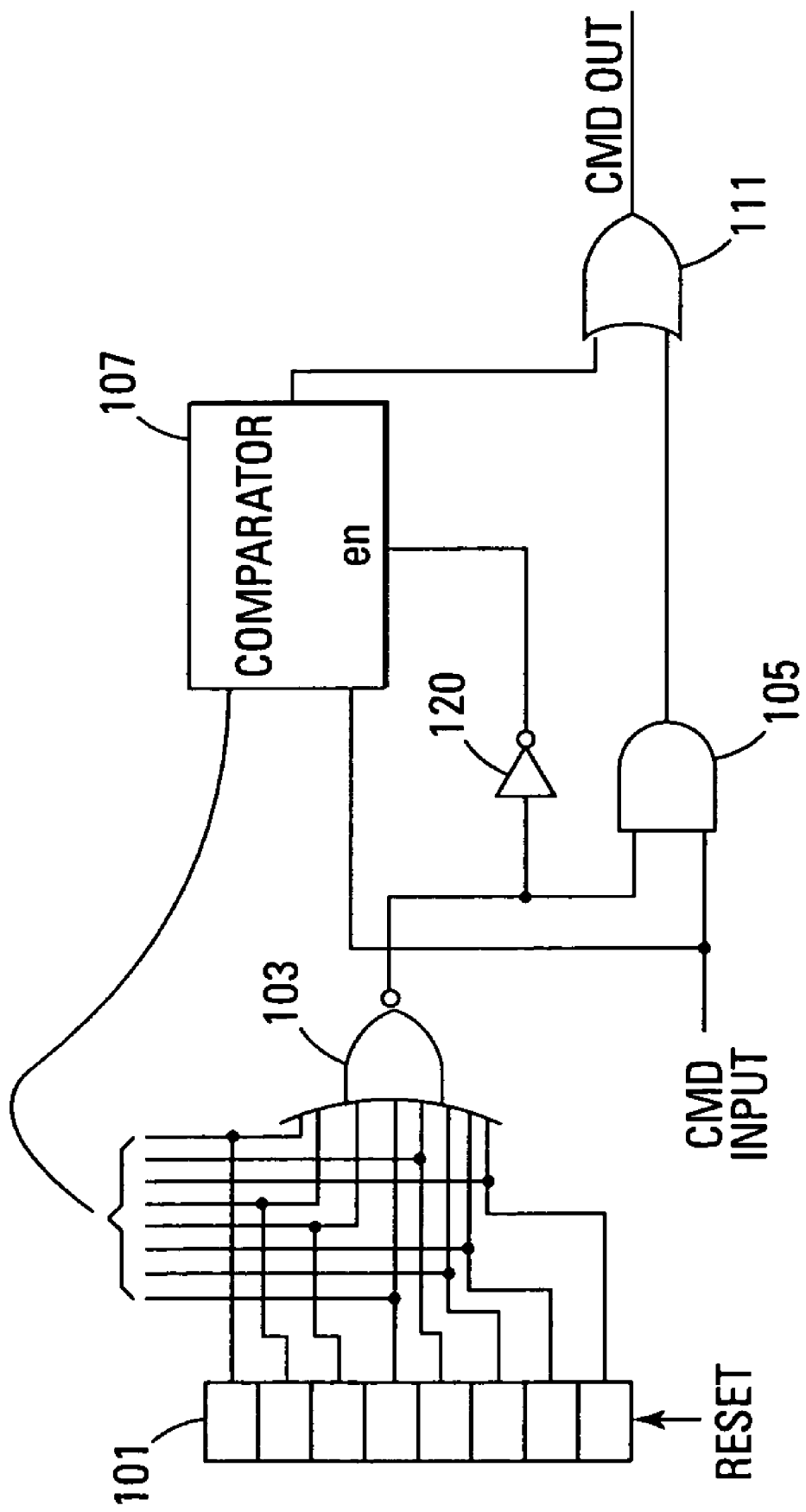
FIG. 1 shows a logic diagram of one embodiment of an apparatus for reconfiguring the commands of a flash memory device.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

While the subsequently described embodiments refer to a NAND flash memory device, the present invention is not limited to such an architecture. The present invention can be implemented in NOR or other types of flash memory configurations.

FIG. 1 illustrates a logic diagram of one embodiment of an apparatus for reconfiguring commands of a flash memory device. This diagram is for purposes of illustration only since the function of the circuit can be accomplished in many different ways. The circuit may be implemented in hardware or, in one embodiment, the circuit functions can be implemented in software that is executed by the memory controller. If the circuit is implemented in hardware, the AND, NOR, and OR functions discussed subsequently can be implemented in logic gates.

The logic diagram is comprised of a register 101 in which a new command is stored. In one embodiment, the register is an 8-bit register. The output of the register 101 is coupled to a NOR function 103. One input to an AND function 105 is coupled to the output of the NOR function 103. The other input to the AND function 105 is coupled to a command input line. The command input can come from the memory controller or from a data input from a processor coupled to the memory device.

The output of the register 101 is also coupled to a comparator function 107. The comparator function 107 is also coupled to the command input line. The comparator is enabled by an inverter 120 that is coupled to the output of the NOR 103 function. This enable signal prevents the comparator from being enabled after the register 101 has been reset to a 00H condition. The output of the comparator function 107 and the output of the AND function 105 are input to an OR function 111. The output of the OR function 111, in one embodiment, is coupled to the memory controller circuit to instruct the controller to perform the desired operation in response to the command.

As discussed subsequently, the comparator function 107 is responsible for comparing two inputs: an input command and a stored reference command from the register 101. The comparator function 107 allows the input command through if it matches the stored reference command. This function 107 is not shown in detail since there are a large number of ways to implement such a function and its composition is known to one skilled in the art.

In operation, the register 101 is reset on power-up. In the illustrated embodiment, the reset operation sets the register contents to all logical zeros. Alternate embodiments could reset the register to other default contents and use other circuit logic to obtain the same results as the illustrated embodiment.

The register 101 with all logic zeros causes the output of the NOR function 103 to be a logic one. The NOR function 103, therefore, is an indication that the register has been changed in some way. When the NOR 103 outputs a logic one, the register is in a reset condition. If the NOR 103 outputs a logic zero, the register has been changed in some way.

When a command is received over the command input line into the AND function 105, the input command is allowed through the AND function 105. The AND function 105 acts as a transfer gate to allow through the signal on the command line input when the other input is a logic 1. The OR function 111 then outputs the command for execution. Thus, the configurable command circuit of the present invention can be used if the memory device is comprised of only one die. The circuit of FIG. 1 would allow that command to flow through without being altered. The received command could then be executed normally.

If the memory device is comprised of multiple dies, the circuit of FIG. 1 would operate in the subsequently described fashion. It is assumed that the memory status command is represented by 70H. However, this is for purposes of illustration only since the present invention is not limited to any one command and/or numerical command representation.

As discussed previously, if a memory status command is normally represented by 70H in a multiple die system, this command would cause each of the dies to output their status on the bus simultaneously. Therefore, the present invention assigns the memory status command of 71H to a first die, 72H to a second die, and 73H to a third die. This has the effect of adding a die address of 1H, 2H, and 3H to the command of 70H. Additional dies in the device could be addressed in a similar fashion.

The command with address (e.g., 71H, 72H, or 73H) is loaded into the register 101 after power-up. The output of the NOR function 103 is then a logic zero, thus inhibiting the AND function 105. The input command is coupled to the comparator function 107 that compares the data stored in the register with the input command. If the two are equal, the input command was meant for the particular memory die and the comparator function 107 outputs the command through the OR function 111. If the two are not equal, the command is blocked through the comparator function 107 in addition to the AND function 105. In such a case, no command is issued to the memory die.

In a NAND flash memory device, the first block (i.e., block 0) of memory is typically considered to be defect free. This block may contain system information that the controller would use to boot up system activities. In one embodiment of the present invention, this block can be used to store, in a non-volatile fashion, the command that is to be loaded into the register 101. The memory controller could accomplish this at the same time that the other boot information is read from this block. In an alternate embodiment, the register 101 is a non-volatile register that stores the desired command after power is removed from the memory device.

Figure 2:
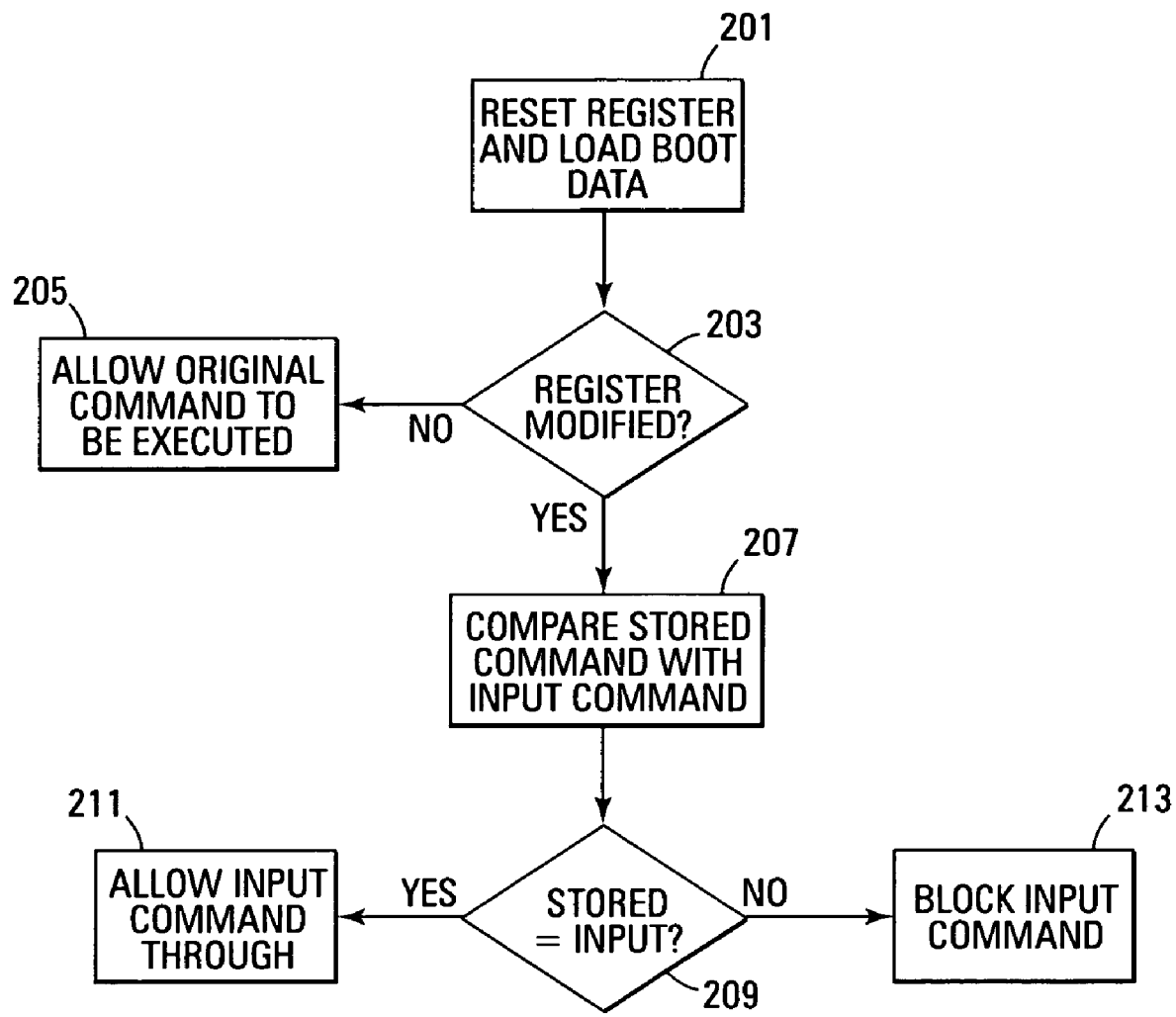
FIG. 2 shows a flowchart of one embodiment of a method of the present invention for reconfiguring the commands of a flash memory device.

FIG. 2 illustrates a flowchart of one embodiment of the method of the present invention for configuring commands for flash memory devices. The register is reset on power-up of the memory device and any relevant boot data is loaded 201. The boot data may include a new command configuration to replace a memory command that does not have an address as described previously. In one embodiment, the new command is loaded from the defect-free, non-volatile memory block.

As discussed previously, the reset operation sets the register to a default state (e.g., all logic 0's). It is then determined if the register has been modified 203 by the writing of new data after the reset operation. If the register has not been modified, the original memory command from a controller, processor, or other controller circuitry is allowed through 205.

If the register has been modified 203 by the storing of a replacement memory command, the stored command is compared with received commands 207. If a received command is the same as the stored command 209, the command is allowed through for execution 211. If the received command is not the same as the stored command 209, the received command is blocked 213 from being executed.

This later case might occur when the processor is writing to another memory die in the memory device. For example, if the embodiment illustrated in FIG. 2 is being executed on a memory die that has been assigned an address of 2H in the memory die stack and a memory command of 73H is received, the processor is sending a command to a die in the stack with an address of 3H. In this case, all of the other dies should block the command from execution.

Figure 3:
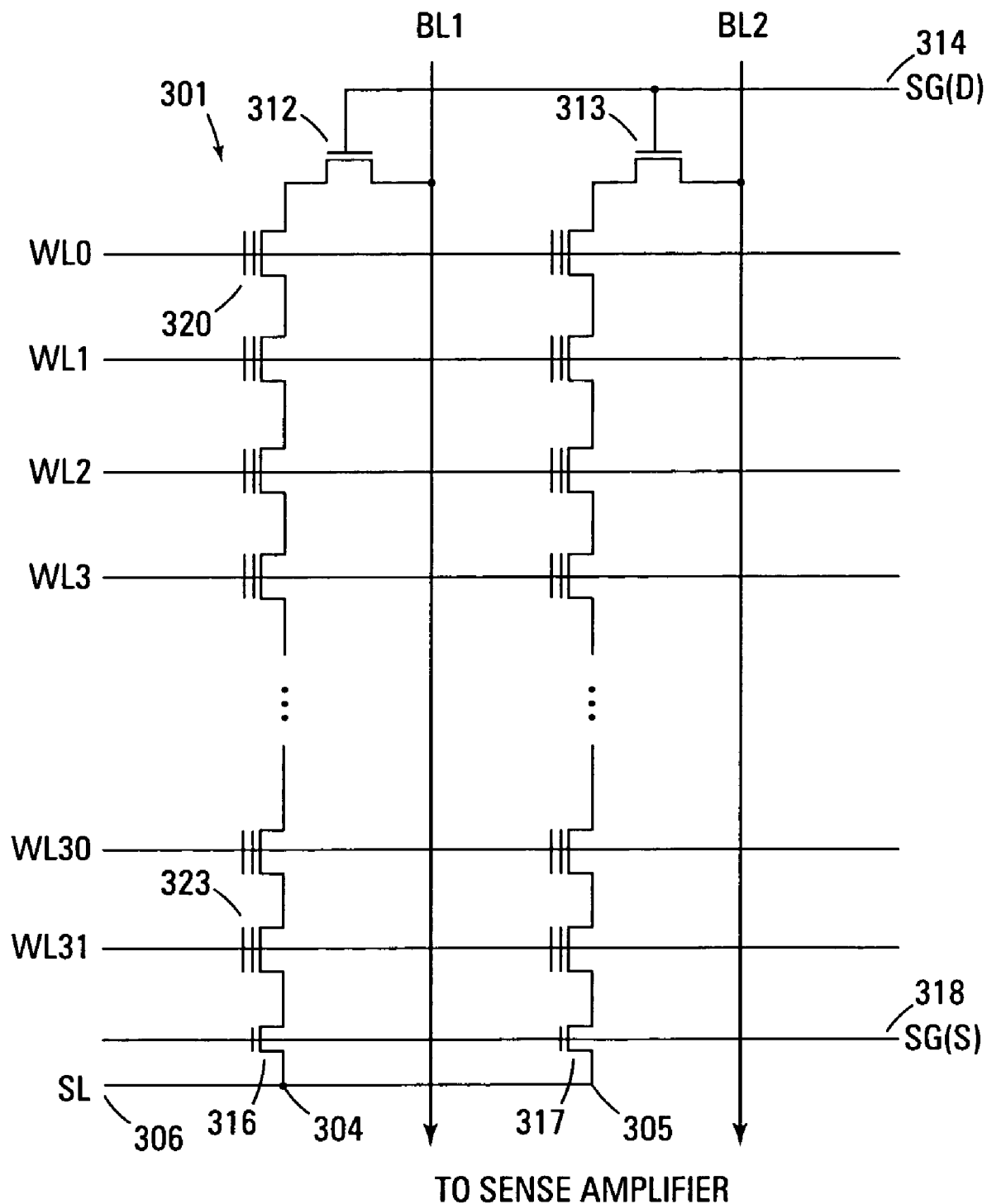
FIG. 3 shows a schematic diagram of one embodiment of a NAND flash memory array of the present invention.

FIG. 3 illustrates a simplified diagram of a typical NAND flash memory array with which the configurable command method and apparatus of the present invention can be used. The memory array of FIG. 3, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 301 arranged in series strings 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bitline (BL1-BLN) by a drain select gate 312, 313. The source select gates 316, 317 are controlled by a source select gate control line SG(S) 318 coupled to their control gates. The drain select gates 312, 313 are controlled by a drain select gate control line SG(D) 314.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

Figure 4:
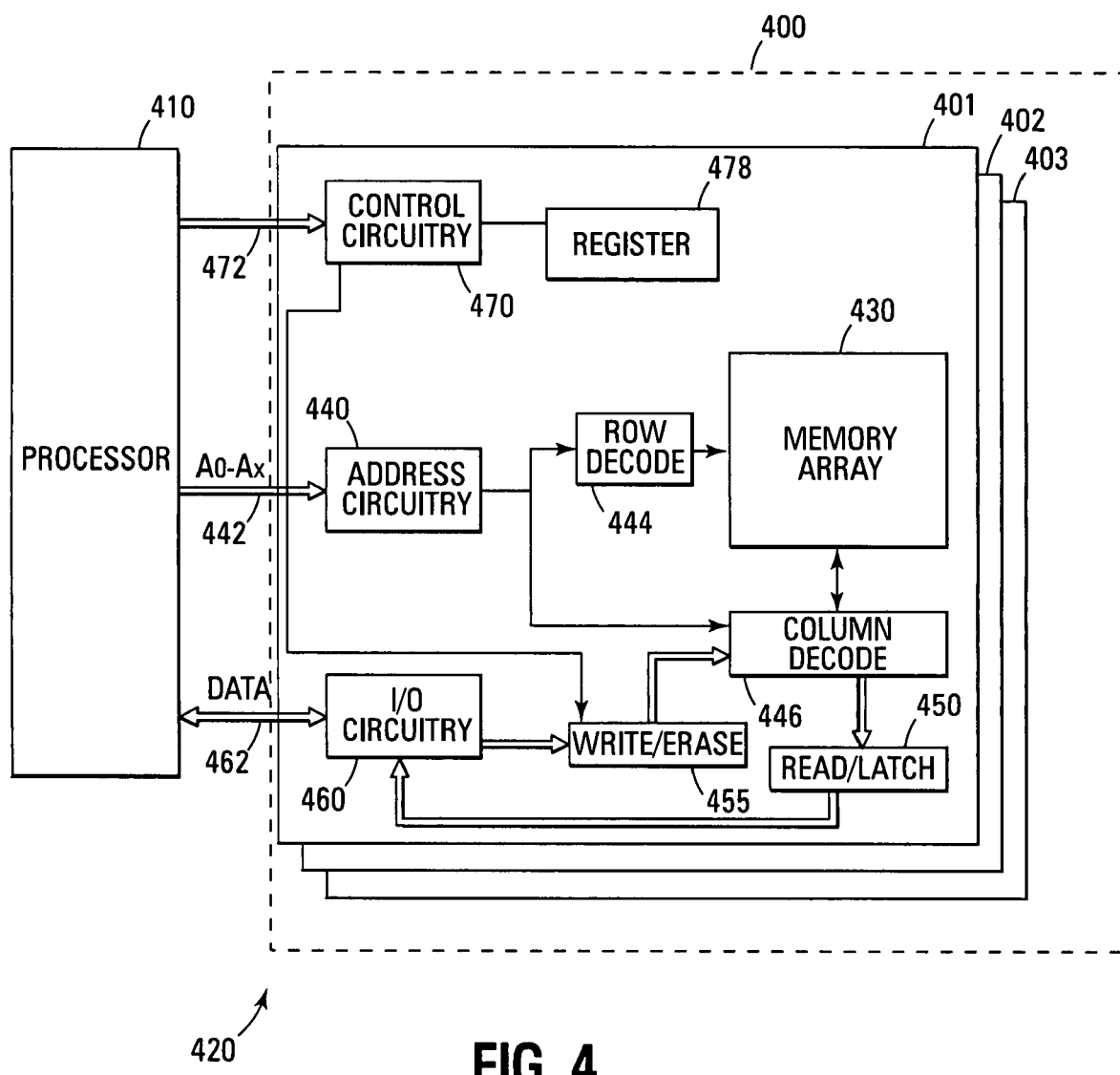
FIG. 4 shows a block diagram of one embodiment of an electronic system of the present invention.

FIG. 4 illustrates a functional block diagram of a memory device 400 that is coupled to a processor 410. The processor 410 may be a microprocessor or some other type of controlling circuitry. The memory device 400 and the processor 410 form part of a memory system 420. The processor 410 is capable of generating memory commands to the memory device 400. The memory device 400 has been simplified to focus on features of the memory that are helpful in understanding the present invention.

In one embodiment, the memory device 400 is comprised of multiple memory dies 401-403. FIG. 4 shows three different memory dies 401-403 in the memory device 400. However, the present invention is not limited to any particular quantity of memory dies in the memory device 400.

The processor 410 can access a particular die 401-403 with a command and address since each die occupies a predetermined range of a memory map. For example, a write command will also include a memory address as part of the command and the particular die at that address will execute the command. If the command does not require an address (e.g., memory status), the method for reconfiguring commands for the flash memory device operates as described previously to determine which die executes the command.

Each memory die 401-403 includes an array of flash memory cells 430 that can be comprised of the flash memory cells as described previously with reference to FIG. 3. In an alternate embodiment, the memory array 430 is a NOR memory array.

The memory array 430 is arranged in banks of rows and columns. The control gates of each row of memory cells is coupled with a wordline while the drain and source connections of the memory cells are coupled to bitlines. As well known in the art, the connections of the cells to the bitlines determines whether the array is a NAND architecture or a NOR architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller that can execute the embodiments of the command reconfiguration method of the present invention. The register 478 and any other required components of the present invention can be separate components or incorporated into the control circuitry 470.

The flash memory device illustrated in FIG. 4 has been simplified to facilitate a basic understanding of the features of the memory. A more detailed understanding of internal circuitry and functions of flash memories are known to those skilled in the art.

CONCLUSION

In summary, the configurable command of the present invention enables a memory device having stacked memory dies to access each of the dies individually with commands that normally do not have associated addresses. This is accomplished without pre-assigning hardwired addresses to the dies during the manufacturing process.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An apparatus for reconfiguring a received command in a memory device, the apparatus comprising:

a register for storing a first command;

indication logic, coupled to the register, for generating an indication signal in response to writing to the register;

transfer gate logic for outputting the received command in response to the indication signal; and a comparator circuit, coupled to the register and the received command, for comparing the received command to the first command and outputting the received command when the received and the first commands are equal.

2. The apparatus of claim 1 and further including a reset signal, coupled to the register, for causing the register to enter a predetermined default state.

3. The apparatus of claim 2 wherein the indication logic is a logical NOR gate having inputs coupled to the contents of the register.

4. The apparatus of claim 3 wherein the NOR gate outputs a logical 1 when all of the inputs have the same logical state.

5. The apparatus of claim 2 wherein the predetermined default state is all logical zeros.

6. The apparatus of claim 1 wherein the transfer gate logic is a logical AND gate.

7. An apparatus for reconfiguring a received command in a flash memory device comprising a plurality of memory dies, each die having a die address, the apparatus comprising:

a register for storing a first command comprising the die address, the register comprising a reset input for setting the register contents to a predetermined state;

indication logic, coupled to the register, for generating an indication signal when the register has stored the first command;

transfer gate logic for outputting the received command in response to the indication signal; and a comparator circuit coupled to the register for comparing the received command to the first command and outputting the first command when the received and the first commands are equal.

8. The apparatus of claim 7 wherein the flash memory device is a NAND architecture flash memory device.

9. The apparatus of claim 7 wherein the flash memory device is a NOR architecture flash memory device.

* * * * *